United States Patent
Lee et al.

(10) Patent No.: US 11,435,660 B2
(45) Date of Patent: Sep. 6, 2022

(54) PHOTOMASK AND METHOD OF FABRICATING A PHOTOMASK

(71) Applicant: TAIWAN SEMICONDUCTOR MANUFACTURING CO., LTD., Hsinchu (TW)

(72) Inventors: Hsin-Chang Lee, Hsinchu County (TW); Ping-Hsun Lin, New Taipei (TW); Yen-Cheng Ho, Taichung (TW); Chih-Cheng Lin, Kaohsiung (TW); Chia-Jen Chen, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 81 days.

(21) Appl. No.: 15/967,159

(22) Filed: Apr. 30, 2018

(65) Prior Publication Data

US 2019/0155140 A1    May 23, 2019

Related U.S. Application Data

(60) Provisional application No. 62/590,089, filed on Nov. 22, 2017.

(51) Int. Cl.
| | |
|---|---|
| *G03F 1/24* | (2012.01) |
| *G03F 1/52* | (2012.01) |
| *G03F 1/68* | (2012.01) |
| *G03F 1/54* | (2012.01) |
| *G03F 1/26* | (2012.01) |

(52) U.S. Cl.
CPC .............. *G03F 1/24* (2013.01); *G03F 1/26* (2013.01); *G03F 1/52* (2013.01); *G03F 1/54* (2013.01); *G03F 1/68* (2013.01)

(58) Field of Classification Search
CPC ..... G03F 1/24; G03F 1/52; G03F 1/54; G03F 1/76
See application file for complete search history.

(56) References Cited

U.S. PATENT DOCUMENTS

| | | | | |
|---|---|---|---|---|
| 2002/0160281 A1* | 10/2002 | Subramanian | ............ | G03F 1/70 430/5 |
| 2006/0240334 A1* | 10/2006 | Huh | ............ | B82Y 10/00 430/5 |
| 2009/0220869 A1* | 9/2009 | Takai | ............ | B82Y 10/00 430/5 |
| 2011/0255163 A1* | 10/2011 | Merrill | ............ | G02B 5/3083 359/487.02 |
| 2012/0107607 A1* | 5/2012 | Takaki | ............ | C09D 183/16 428/336 |
| 2014/0234756 A1* | 8/2014 | Kinoshita | ............ | G03F 1/24 430/5 |
| 2015/0147687 A1* | 5/2015 | Lu | ............ | G03F 1/24 430/5 |

* cited by examiner

*Primary Examiner* — Daborah Chacko-Davis
(74) *Attorney, Agent, or Firm* — McDermott Will & Emery LLP

(57) ABSTRACT

A method of fabricating a photomask includes selectively exposing portions of a photomask blank to radiation to change an optical property of the portions of the photomask blank exposed to the radiation, thereby forming a pattern of exposed portions of the photomask blank and unexposed portions of the photomask blank. The pattern corresponds to a pattern of semiconductor device features.

20 Claims, 13 Drawing Sheets

PHOTOMASK AND METHOD OF FABRICATING A PHOTOMASK

CROSS-REFERENCE TO RELATED APPLICATIONS

This application claims priority to U.S. Provisional Patent Application 62/590,089 filed Nov. 22, 2017, the entire disclosure of which is incorporated herein by reference.

TECHNICAL FIELD

The disclosure relates to photolithography and more particularly to photomasks and methods of manufacturing photomasks for photolithography.

BACKGROUND

As the semiconductor industry has progressed into nanometer technology process nodes in pursuit of higher device density, higher performance, and lower costs, challenges from both fabrication and design issues become greater. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Photolithography operations are one of the key operations in the semiconductor manufacturing process. Photolithography techniques include ultraviolet lithography, deep ultraviolet lithography, and extreme ultraviolet lithography (EUVL). The photomask is an important component in photolithography operations. It is critical to fabricate and maintain photomasks free of resolvable defects. However, photomask fabrication techniques typically include electron beam lithography and etching operations. Electron beam lithography can generate particles during resist coating, development, and stripping operations. Etching operations can generate particles and etching residues. Particles and etching residues can cause defects in imaging when the mask is used if the particles and residues are not completely removed during a cleaning operation. In addition etched sidewalls of photomask patterns may also be sources of particles.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Figure 1:
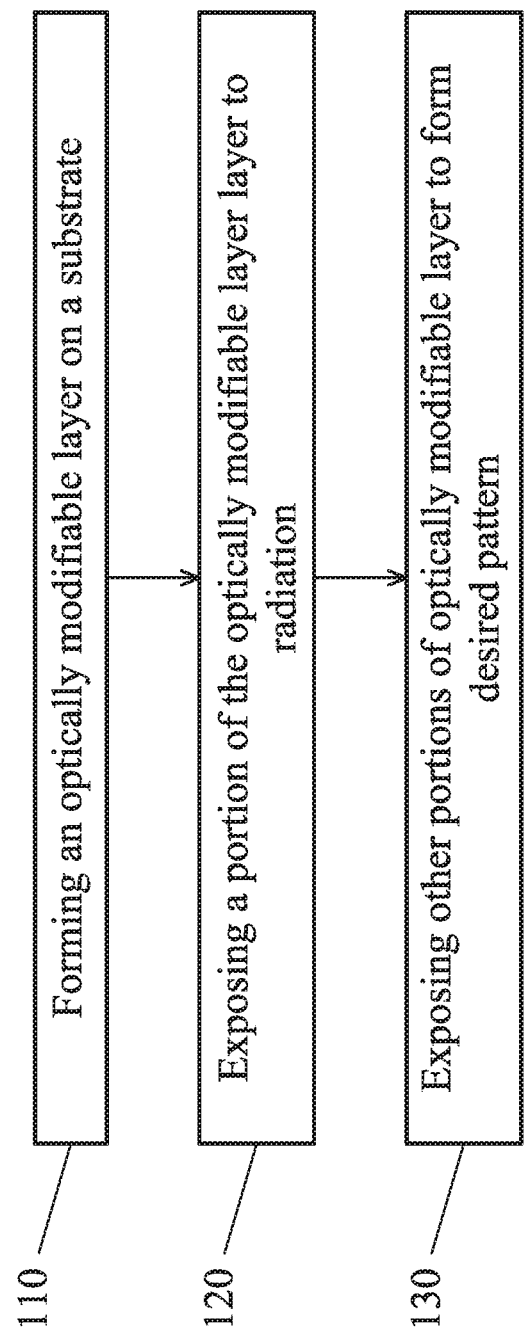
FIG. 1 is a flow chart of a method of fabricating a photomask according to an embodiment of the disclosure.

FIG. 1 is a flow chart of a method of fabricating a photomask according to an embodiment of the disclosure. The method 100 of fabricating the photomask includes operations of forming 110 an optically modifiable layer on a substrate, exposing 120 a portion of the optically modifiable layer to radiation, and exposing 130 other portions of the optically modifiable layer to radiation to form a desired pattern of exposed portions in the optically modifiable layer.

Figure 2:
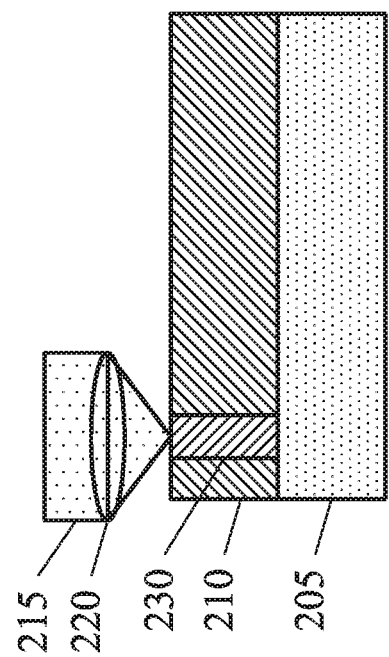
FIG. 2 is a cross sectional view of a sequential stage of a method for fabricating a photomask according to an embodiment of the disclosure.
Figure 3:
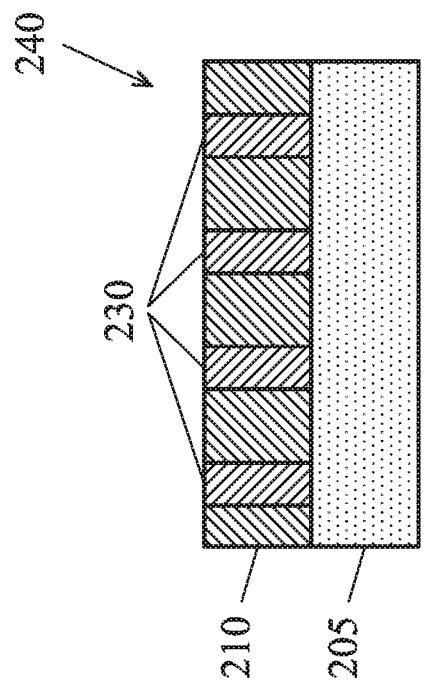
FIG. 3 is a cross sectional view of a sequential stage of a method for fabricating a photomask according to an embodiment of the disclosure.
Figure 4:
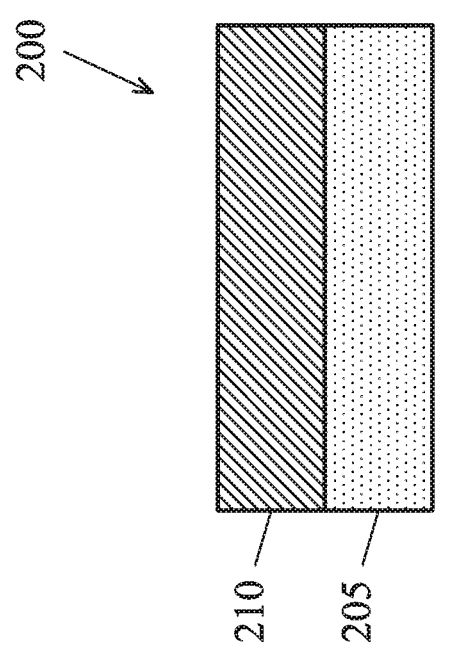
FIG. 4 is a cross sectional view of a sequential stage of a method for fabricating a photomask according to an embodiment of the disclosure.

The method of fabricating a photomask will be explained in further detail with reference to FIGS. 2-4. FIGS. 2-4 are cross sectional view of sequential stages of a method for fabricating a photomask 240 according to an embodiment of the disclosure. As shown in FIG. 2, an optically modifiable layer 210 is formed over a substrate 205 to form a photomask blank 200.

The optically modifiable layer 210 is a formed of a material that absorbs radiation. In some embodiments, the optically modifiable layer 210 is formed of a material that absorbs light in the infrared wavelengths, visible wavelengths, and ultraviolet wavelengths. The infrared wavelengths range from about 700 nm to about 1 mm. Visible wavelengths range from about 390 nm to about 700 nm. Ultraviolet wavelengths range from about 1 nm to about 390 nm. Ultraviolet wavelengths include deep ultraviolet, about 100 nm to about 300 nm; and extreme ultraviolet, about 1 nm to about 100 nm.

The substrate 205 is formed of a low thermal expansion material in some embodiments. In some embodiments, the substrate is a low thermal expansion glass or quartz, such as fused silica or fused quartz. In some embodiments, the low thermal expansion glass substrate transmits light at visible wavelengths, a portion of the infrared wavelengths near the visible spectrum (near-infrared), and a portion of the ultraviolet wavelengths. In some embodiments, the low thermal expansion glass substrate absorbs extreme ultraviolet wavelengths and deep ultraviolet wavelengths near the extreme ultraviolet.

The optically modifiable layer 210 can be a suitable material that absorbs radiation and undergoes a radiation-matter interaction, thereby changing an optical property of the portions that are exposed to the radiation. In some embodiments, the radiation-matter interaction is selected from the group consisting of ionization, absorption, photolysis, and crystallization. In other words, the portion of the optically modifiable layer 210 that absorbs the radiation undergoes a change in one or more optical properties upon absorption of the radiation by the optically modifiable material. The optical properties changed includes a change in the ionization state of the optically modifiable material in some embodiments. Alternatively, in some embodiments, the optically modifiable layer undergoes a change in its light absorption properties, such as an increase or decrease in light absorption. In some embodiments, the portion of optically modifiable layer absorbing the radiation undergoes a photochemical reaction in which the exposed portion of the optically modifiable layer 210 is broken down by the absorbed light. Or the exposed portion of the optically modifiable layer 210 undergoes a change in crystalline structure in some embodiments. In some embodiments, the change in crystalline structure is a change to a different crystalline structure. In other embodiments, the change in crystalline structure is a change from a crystalline structure to an amorphous structure, or vice versa. The optically modifiable material is selected so that it does not undergo a radiation-matter interaction at the light wavelengths that the photomask will be exposed to when used in photolithography operations to form semiconductor devices.

The optically modifiable layer 210 is subsequently selectively exposed to radiation, as shown in FIG. 3. Radiation 215 is directed to selected portions of the optically modifiable layer 210. In some embodiments, the radiation is light 215 passed through an optical element(s) 220, such as one or more lenses, to focus the light at a desired location on the optically modifiable layer 210. The radiation 215 impinging on the optically modifiable layer 210 causes the portion of the optically modifiable layer to undergo a radiation-matter interaction, thereby changing an optical property of the portion exposed to the radiation, and forming portions 230 of the optically modifiable layer having modified optical properties.

In some embodiments, the optical properties that are modified by the radiation-matter interaction include extreme ultraviolet reflectivity, deep ultraviolet reflectivity, ultraviolet absorption, infrared absorption, visible light absorption, or Raman spectra. In some embodiments, exposure to the radiation modifies the reflectivity of the portion of the optically modifiable layer, such that the exposed portion 230 reflects light, such as extreme ultraviolet or deep ultraviolet, while the unexposed portion 210 absorbs light, such as extreme ultraviolet or deep ultraviolet. In other embodiments, exposure to the radiation modifies the absorption of the portion of the optically modifiable layer, such that the exposed portion 230 transmits light, such as visible light and infrared light while the unexposed portion 210 absorbs light, such as ultraviolet.

In some embodiments, the radiation is light of any suitable wavelength that causes a radiation-matter interaction with the optically modifiable layer, including infrared, visible, and ultraviolet, including deep ultraviolet and extreme ultraviolet. Any suitable light source can be used, including coherent or non-coherent light sources, pulsed light sources, and continuous wavelength light sources. In some embodiments, the light source is a laser light source, including an ultraviolet excimer laser, such as a KrF or ArF laser. In some embodiments, the light source is a $CO_2$ laser-excited Sn plasma. In some embodiments, the light source is a HeNe laser. In some embodiments, the radiation source is an electron beam or an ion beam.

In some embodiments, the selective radiation exposure is repeated a plurality of times to form a photomask 240 having a plurality of exposed portions 230 in the optically modifiable layer 210, as shown in FIG. 4. In some embodiments, the radiation is scanned over the optically modifiable layer 210 in a patternwise manner to form a pattern of exposed portions 230. In other embodiments, exposure light is passed through or reflected off a photomask having the desired pattern.

Figure 5:
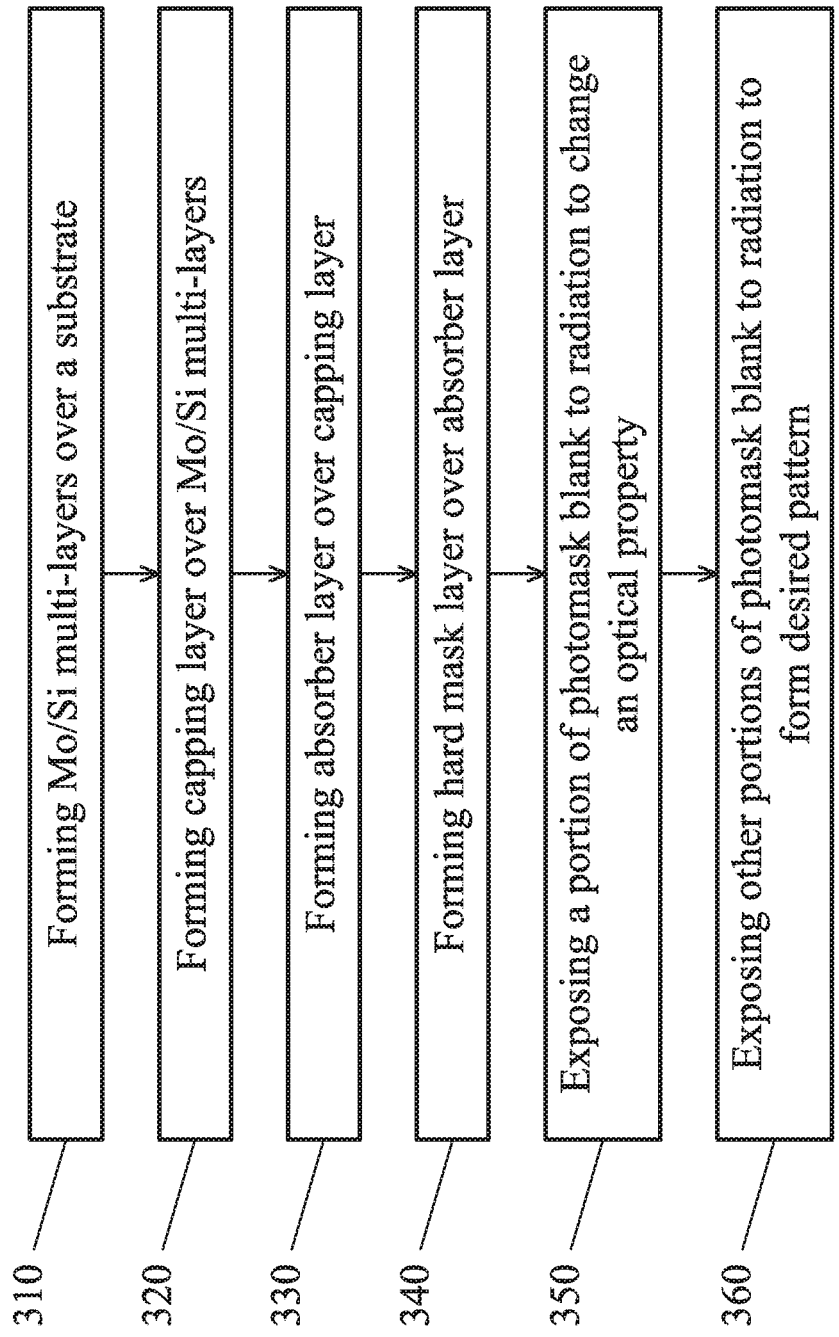
FIG. 5 is a flow chart of a method of fabricating a photomask according to an embodiment of the disclosure.

FIG. 5 is a flow chart of a method of fabricating a photomask according to another embodiment of the disclosure. In this embodiment, a photomask for use in extreme ultraviolet lithography (EUVL) is fabricated. EUVL employs scanners using light in the extreme ultraviolet (EUV) region, having a wavelength of about 1 nm to about 100 nm. The mask is a critical component of an EUVL system. Because no optical materials are transparent to EUV radiation, EUV masks are reflective masks. EUV masks require very low surface roughness and must have no resolvable defects.

Figure 6:
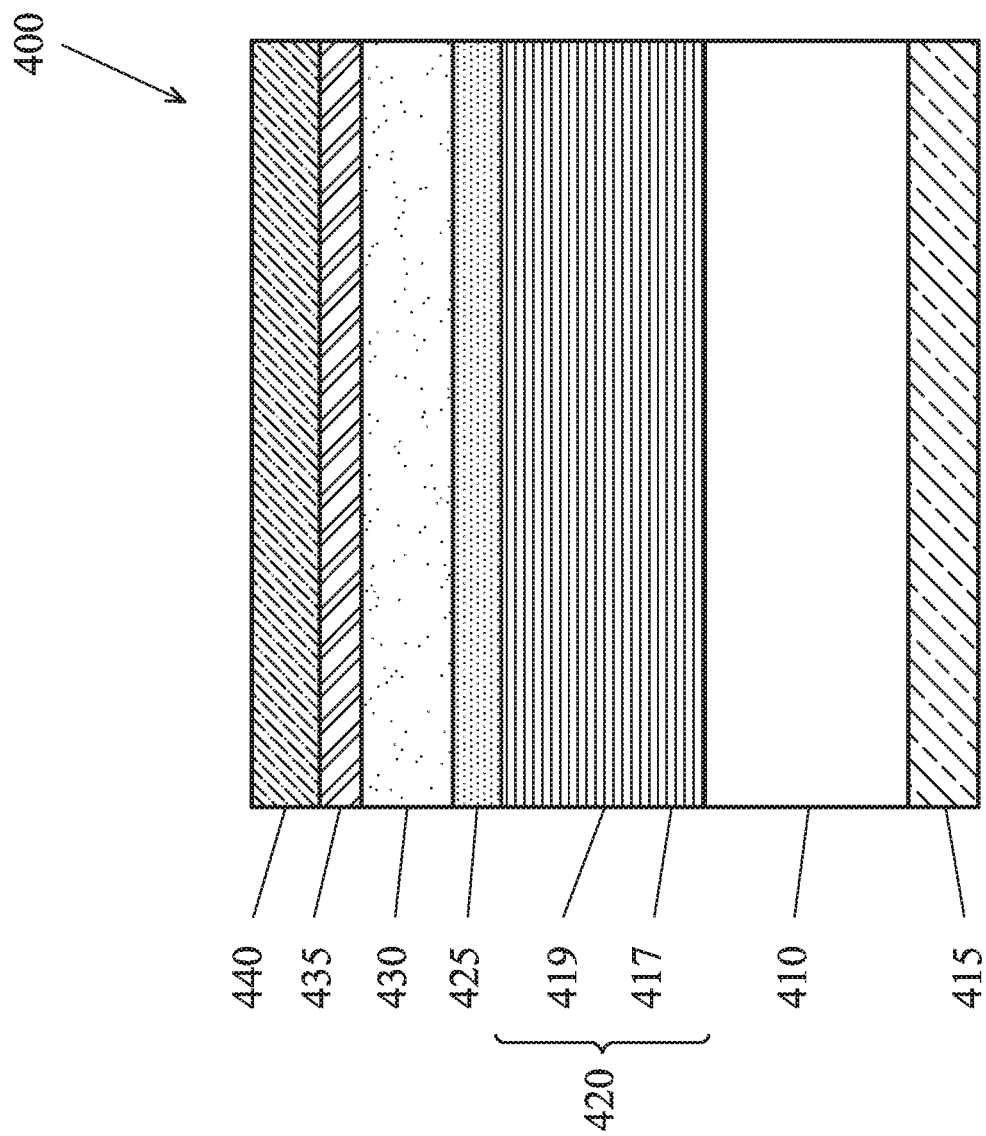
FIG. 6 is a cross sectional view of a sequential stage of a method for fabricating a photomask according to an embodiment of the disclosure.

An extreme ultraviolet photomask blank 400 is illustrated in FIG. 6. The photomask blank 400 is fabricated according to operations listed in flow chart 300 in FIG. 5 in some embodiments. In some embodiments, multiple alternating layers of silicon 417 and molybdenum 419 forming a Mo/Si multilayer 420 are disposed over a low thermal expansion substrate 410, as shown in operation 310. In some embodiments, the low thermal expansion substrate 420 is a glass, such as fused silica glass.

In some embodiments, from about 30 alternating layers each of silicon and molybdenum to about 60 alternating layers each of silicon and molybdenum are formed. In certain embodiments, from about 40 to about 50 alternating layers each of silicon and molybdenum are formed. In some embodiments, the silicon and molybdenum layers are formed by chemical vapor deposition (CVD), plasma-enhanced CVD (PECVD), atomic layer deposition (ALD), physical vapor deposition (PVD) (sputtering), or any other suitable film forming method. Each layer of silicon and molybdenum is about 2 nm to about 10 nm thick. In some embodiments, the layers of silicon and molybdenum are about the same thickness. In other embodiments, the layers of silicon and molybdenum are different thicknesses. In some embodiments, the thickness of each layer of silicon and molybdenum is about 3 nm to about 4 nm.

A capping layer 425 is subsequently formed over the Mo/Si multilayer 420 in operation 320. In some embodiments, the capping layer 425 is made of ruthenium having a thickness of from about 2 nm to about 10 nm. In certain embodiments, the thickness of the capping layer 425 is from about 2 nm to about 4 nm. In some embodiments, the capping layer 425 is formed by chemical vapor deposition, plasma-enhanced chemical vapor deposition, atomic layer deposition, physical vapor deposition, or any other suitable film forming method.

Then, an absorber layer 430 is formed over the capping layer 425 in operation 330. In some embodiments, the absorber layer 430 is Ta-based material. In some embodiments the absorber layer is made of TaN, TaO, TaBN, or TaBO having a thickness from about 25 nm to about 100 nm. In certain embodiments, the absorber layer 430 thickness ranges from about 50 nm to about 75 nm. In some embodiments, the absorber layer 430 is formed by chemical vapor deposition, plasma-enhanced chemical vapor deposition, atomic layer deposition, physical vapor deposition, or any other suitable film forming method.

In some embodiments, an antireflective layer 435 is formed over the absorber layer 430. The antireflective layer 435 is made of a silicon oxide in some embodiments, and has a thickness of from about 2 nm to about 10 nm. In some embodiments, the thickness of the antireflective layer 435 is from about 3 nm to about 6 nm. In some embodiments, the antireflective layer 435 is formed by chemical vapor deposition, plasma-enhanced chemical vapor deposition, atomic layer deposition, physical vapor deposition, or any other suitable film forming method.

A hard mask layer 440 is subsequently formed over the absorbing layer 430 in operation 340. The hard mask layer 440 is formed over the antireflective layer 435 in some embodiments. In some embodiments, the hard mask layer 440 is made of silicon, a silicon-based, chromium, or a chromium-based compound having a thickness of about 4 nm to about 20 nm. In some embodiments, the hard mask layer 440 is formed by chemical vapor deposition, plasma-enhanced chemical vapor deposition, atomic layer deposition, physical vapor deposition, or any other suitable film forming method.

In some embodiments, a conductive layer 415 is formed on a second main surface of the substrate 410 opposing the first main surface of the substrate 410 on which the Mo/Si multilayer 420 is formed. In some embodiments, the conductive layer 415 is made of chromium, chromium nitride, or TaB having a thickness of about 25 nm to about 150 nm. In some embodiments, the conductive layer 415 has a thickness of about 70 nm to about 100 nm. In some embodiments, the conductive layer 415 is formed by chemical vapor deposition, plasma-enhanced chemical vapor deposition, atomic layer deposition, physical vapor deposition, or any other suitable film forming method.

Figure 7:
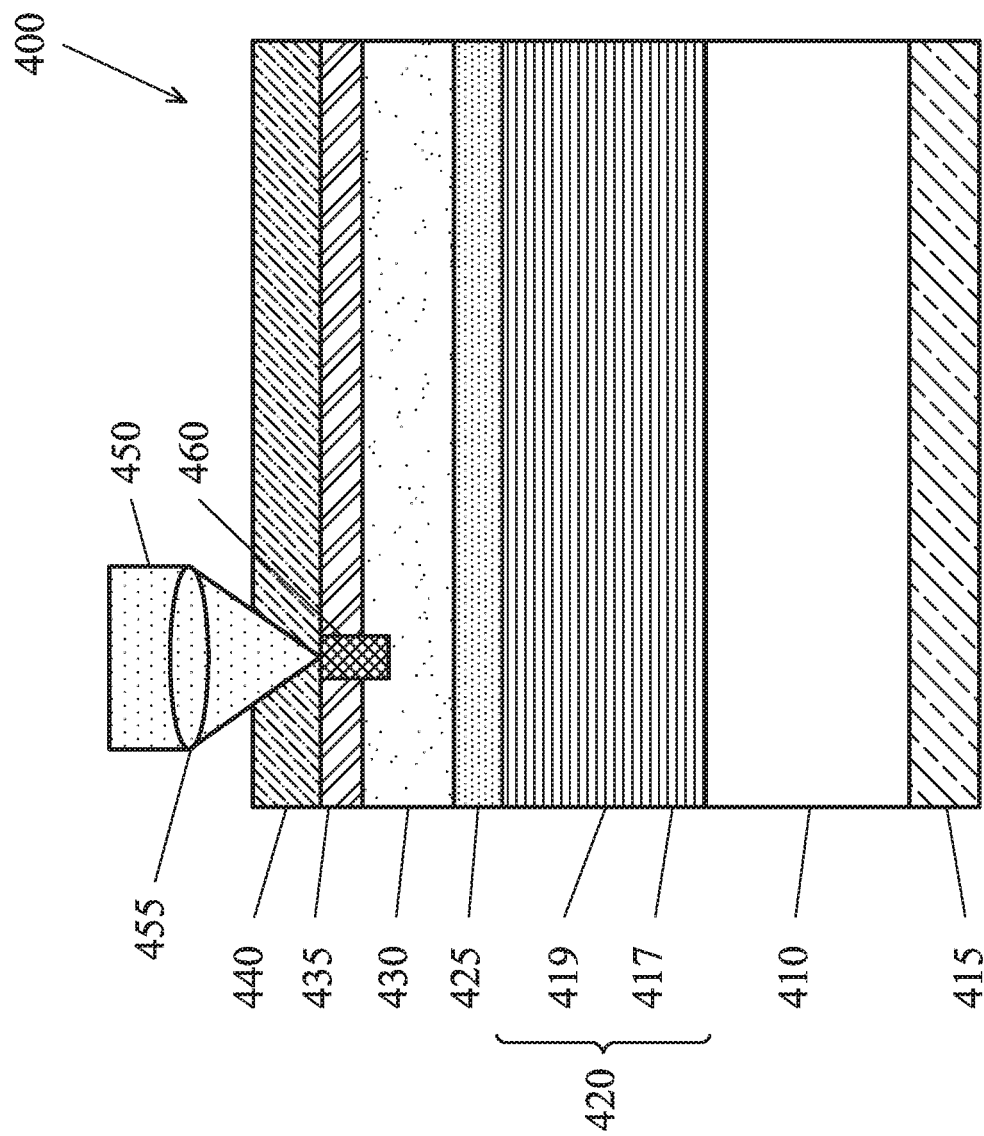
FIG. 7 is a cross sectional view of a sequential stage of a method for fabricating a photomask according to an embodiment of the disclosure.

A portion of the photomask blank 400 is subsequently exposed to radiation to change an optical property of the exposed portion in operation 350, as shown in FIG. 7. The radiation 450 is directed to selected portions of the photomask blank 400. In some embodiments, the radiation 450 is light passed through an optical element(s) 455, such as one or more lenses, to focus the light at a desired location on the photomask blank 400. The radiation 450 impinging on the photomask blank 400 causes the portion of the photomask blank exposed to the radiation to undergo a radiation-matter interaction, thereby changing an optical property of the portion exposed to the radiation, and forming portions of the photomask blank having modified optical properties 460.

In some embodiments, the radiation 450 is focused near the surface of the photomask blank 400 to cause a change in an optical property near the surface of the photomask blank, as shown in FIG. 7. In some embodiments, the portion of the photomask blank having modified optical properties 460 starts just below the hard mask layer 440. The portion having modified optical properties 460 extends below the hard mask layer 440 into one or more layers under the hard mask layer 440 in some embodiments. In some embodiments, the optical properties of the absorber layer 430 or capping layer 425 are changed.

In some embodiments, the optical properties that are modified by the radiation-matter interaction include extreme ultraviolet reflectivity, deep ultraviolet reflectivity, ultraviolet absorption, infrared absorption, visible light absorption, and Raman spectra. In some embodiments, exposure to radiation modifies the reflectivity of the portion of the optically modifiable layer, such that the exposed portion 460 absorbs a greater amount of extreme ultraviolet light than the unexposed portion 445. In other words, the portion 460 of the optically modifiable layer exposed to the radiation is optically modified so that it reflects less light than the unexposed portion in some embodiments. The change in reflectivity depends on the optically modifiable material, and the wavelength and power of the exposure radiation. In some embodiments the change in reflectivity is in a range of several percent to 10 times or more. For example, in certain embodiments, the reflectivity of the exposed portion 460 is reduced from about 65% to about 2%.

In some embodiments, the radiation 450 is light of any suitable wavelength that causes a light-matter interaction with the optically modifiable layer, such as infrared, visible, and ultraviolet, including deep ultraviolet and extreme ultraviolet. Any suitable light source can be used, including coherent or non-coherent light sources, pulsed light sources, and continuous wavelength light sources. In some embodiments, the light source is a laser light source, including a $CO_2$ laser-excited Sn plasma, a HeNe laser, or an ultraviolet excimer laser, such as a KrF or ArF laser. In some embodiments, an electron beam or an ion beam is used to expose portions of the optically modifiable layer.

The wavelength and power of the exposure radiation is selected depending on the degree of optical property modification change desired in the optically modifiable material. For example, if a crystalline change is desired in the optically modifiable material, a lower power is used than if a photolysis or ionization of the optically modifiable material is desired. In some embodiments, a crystalline change is used to change the light transmission of an optically modifiable material. For example, if the optically modifiable material is a crystalline polymer changing the exposed portion to an amorphous state increases the light transmission of the polymer in some embodiments. Likewise, if the optically modifiable material is an amorphous polymer changing the exposed portion to a crystalline state increases the light absorption or reflectivity of the exposed portion in some embodiments.

Figure 8:
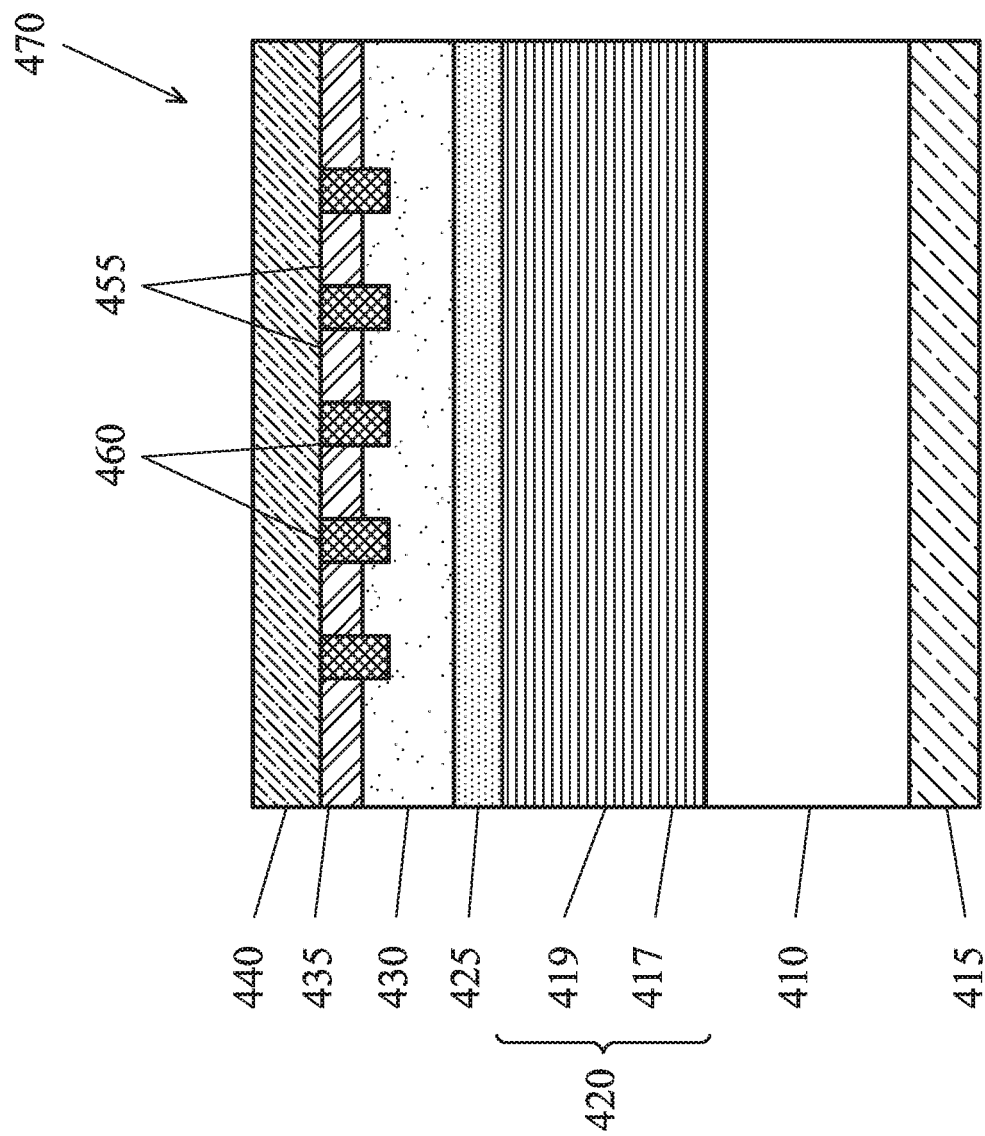
FIG. 8 is a cross sectional view of a sequential stage of a method for fabricating a photomask according to an embodiment of the disclosure.

In some embodiments, other portions of the photomask blank 400 are exposed to radiation to form a desired pattern of exposed portions in operation 360. In some embodiments, the selective light exposure is repeated a plurality of times to form a plurality of exposed portions 460, and unexposed portions 445 of the hard mask layer 440, as shown in FIG. 8. In some embodiments, the radiation is scanned over the optically modifiable layer 210 in a patternwise manner to form a pattern of exposed portions 460. In other embodiments, the radiation is light is passed through or reflected off a photomask having the desired pattern. The pattern of exposed portions 460 and unexposed portions 445 having different optical properties forms an EUVL photomask 470 in some embodiments. For example, in some embodiments, the reflectivity of the portion 460 of the optically modifiable layer exposed to the radiation portion 460 is decreased relative to the unexposed portion 445. In some embodiments, the pattern of the exposed portions 460 and unexposed portions 445 corresponds to a pattern of semiconductor device features for which the photomask 470 will be used to form in subsequent operations.

Figure 9:
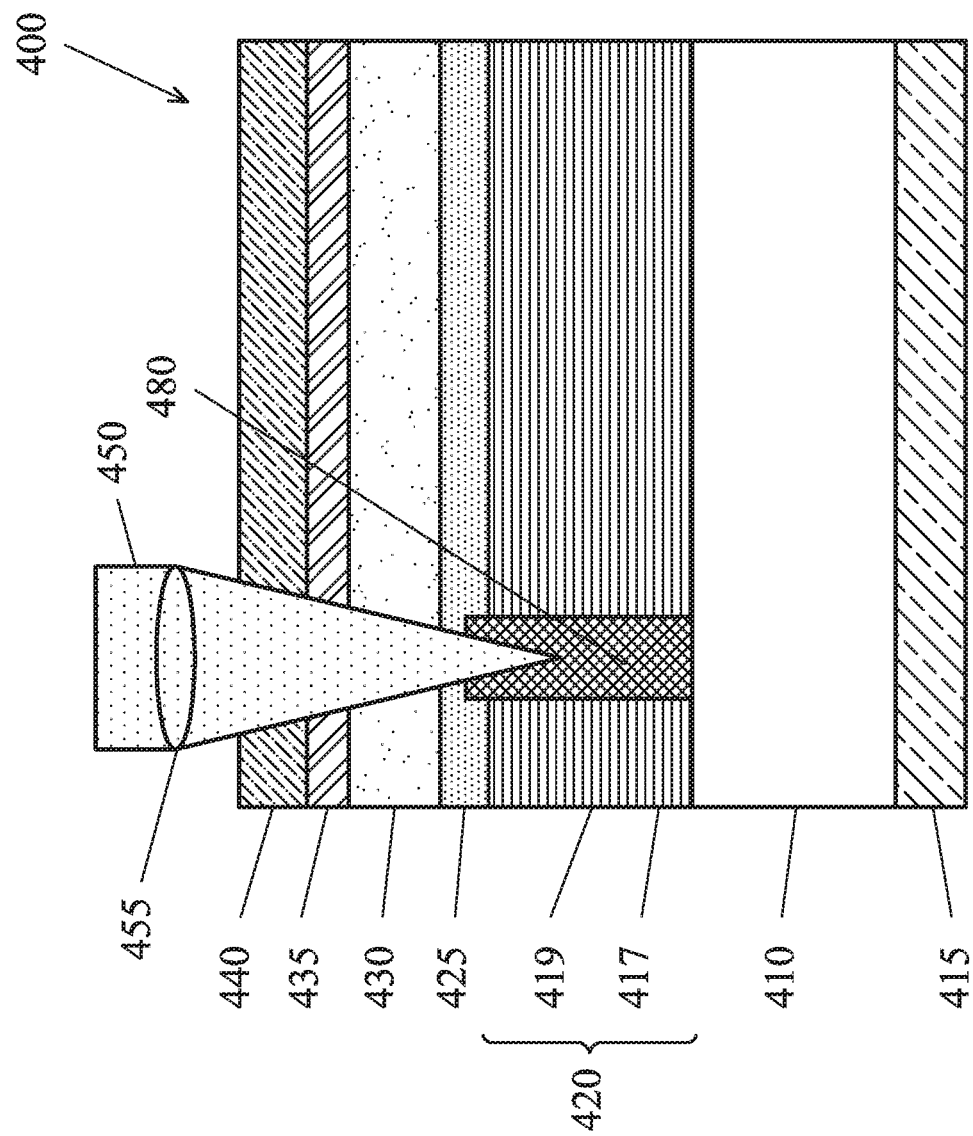
FIG. 9 is a cross sectional view of a sequential stage of a method for fabricating a photomask according to an embodiment of the disclosure.

In another embodiment of the disclosure, an interior portion of the photomask blank 400 under the upper surface of the photomask blank is exposed to radiation to change an optical property of the exposed portion 480, as shown in FIG. 9. In some embodiments, the radiation 450 is light passed through an optical element(s) 455, such as one or more lenses, to focus the light at a desired location in the interior of the photomask blank 400. The radiation 450 focused on an interior portion of the photomask blank 400 causes the portion of the photomask blank exposed to the radiation to undergo a radiation-matter interaction, thereby changing an optical property of the portion exposed to the radiation, and forming portions of the photomask blank having modified optical properties 480.

In some embodiments, the radiation 450 is focused at about the Mo/Si multilayer 420 of the photomask blank 400 to cause a change in an optical property in an interior portion of the photomask blank, as shown in FIG. 9. In some embodiments, the portion of the photomask blank having modified optical properties 480 extends from the Mo/Si multilayer 420 up into the capping layer 425 and the absorber layer 430.

In some embodiments, exposure to radiation modifies the reflectivity of the portion of Mo/Si multilayer 420, such that the exposed portion 480 absorbs a greater amount of extreme ultraviolet light than the unexposed portion 485 of the Mo/Si multilayer. In other words, the portion 480 of the optically modifiable layer exposed to the radiation is optically modified so that it reflects less light than the unexposed portion 485 in some embodiments. In some embodiments the change in reflectivity is in a range of several percent to 10 times or more. For example, in certain embodiments, the reflectivity of the exposed portion 480 is reduced from about 65% to about 2%.

Figure 10:
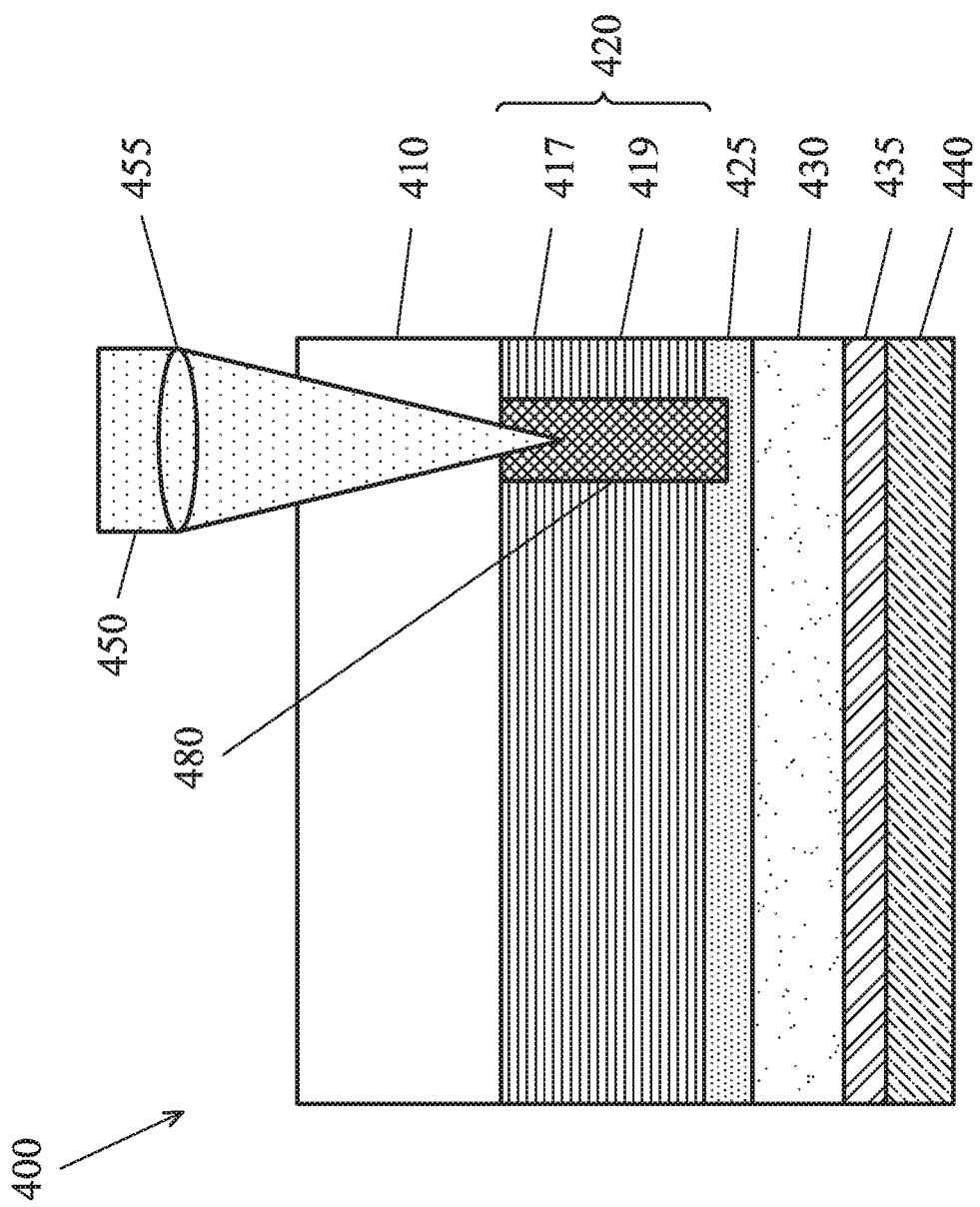
FIG. 10 is a cross sectional view of a sequential stage of a method for fabricating a photomask according to an embodiment of the disclosure.

In some embodiments, the photomask blank 400 is exposed to radiation 450 from the substrate 410 side of the photomask blank 400, as shown in FIG. 10. In some embodiments, the radiation 450 is HeNe laser light having a wavelength of about 632 nm. At 632 nm, the light absorption is much larger for the molybdenum layers 419 than for a silicon dioxide-based substrate 410, thereby heating the molybdenum layers 419, and causing molybenum/silicon interdiffusion. The portions of the photomask blank 400 that are exposed to the light source 450 have decreased EUV reflectivity relative to the unexposed portions of the photomask blank 400. In some embodiments, the change in reflectivity is in a range of several percent to 10 times or more. For example, in certain embodiments, the reflectivity of the exposed portion 480 is reduced from about 65% to about 2%.

FIG. 10 shows the absorber layer 430, antireflective layer 435, and hard mask layer 440, however, in some embodiments, the photomask blank 400 is exposed to radiation 450 before any or all of the absorber layer 430, antireflective layer 435, and hard mask layer 440 are formed. In certain embodiments, a conductive layer 415, as shown in FIG. 9, is formed after the selective exposure of the photomask blank 400 to radiation 450.

In some embodiments, the optical properties that are modified by the radiation-matter interaction include extreme ultraviolet reflectivity, deep ultraviolet reflectivity, ultraviolet absorption, infrared absorption, visible light absorption, or Raman spectra.

In some embodiments, the radiation 450 is light of any suitable wavelength that causes a light-matter interaction with the optically modifiable layer, including infrared, visible, and ultraviolet, including deep ultraviolet and extreme ultraviolet. Any suitable light source can be used, including coherent or non-coherent light sources, pulsed light sources, and continuous wavelength light sources. In some embodiments, the light source is a laser light source, including an HeNe laser, or an ultraviolet excimer laser, such as a KrF or ArF laser. In some embodiments, the light source is a $CO_2$ laser-excited Sn plasma. In some embodiments, the radiation source is an electron beam or ion beam.

The wavelength and power of the exposure radiation is selected depending on the degree of optical property modification change desired in the optically modifiable material. For example, if a crystalline change is desired in the optically modifiable material, a lower power is used than if a photolysis or ionization of the optically modifiable material is desired in some embodiments. In some embodiments, the exposure to radiation causes the Si layers 417 and the Mo layers 420 in the exposed portion 480 diffuse into one another so that the exposed portion 480 becomes one layer of Mo and Si, instead of alternating layers of Mo and Si in the unexposed portions 485.

Figure 11:
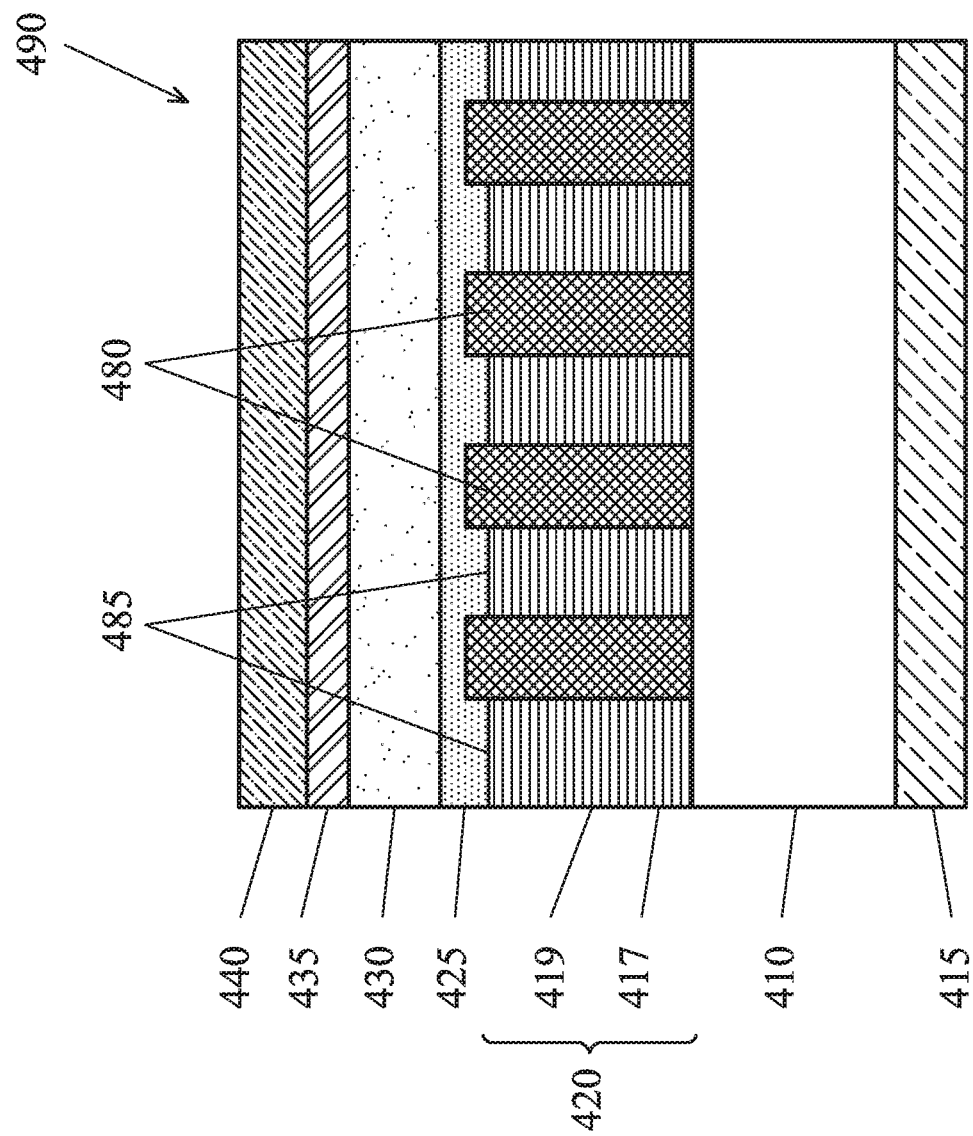
FIG. 11 is a cross sectional view of a sequential stage of a method for fabricating a photomask according to an embodiment of the disclosure.

In some embodiments, other portions of the photomask blank 400 are exposed to radiation to form a desired pattern of exposed portions 480, as shown in FIG. 11. In some embodiments, the selective radiation exposure is repeated a plurality of times to form a plurality of exposed portions 480, and unexposed portions 485 of the Mo/Si multilayer 420, as shown in FIG. 11. In some embodiments, the radiation is light scanned over the photomask blank 400 in a patternwise manner to form a pattern of exposed portions 480. In other embodiments, the radiation is light is passed through or reflected off a photomask having the desired pattern.

The pattern of exposed portions 480 and unexposed portions 485 having different optical properties forms an EUV photomask 490 in some embodiments. For example, in some embodiments, the reflectivity of the portion 480 of the Mo/Si multilayer 420 exposed to the radiation is decreased relative to the unexposed portion 485. In some embodiments, the pattern of the exposed portions 460 and unexposed portions 445 corresponds to a pattern of semiconductor device features for which the photomask 490 will be used to form in subsequent operations.

Figure 12:
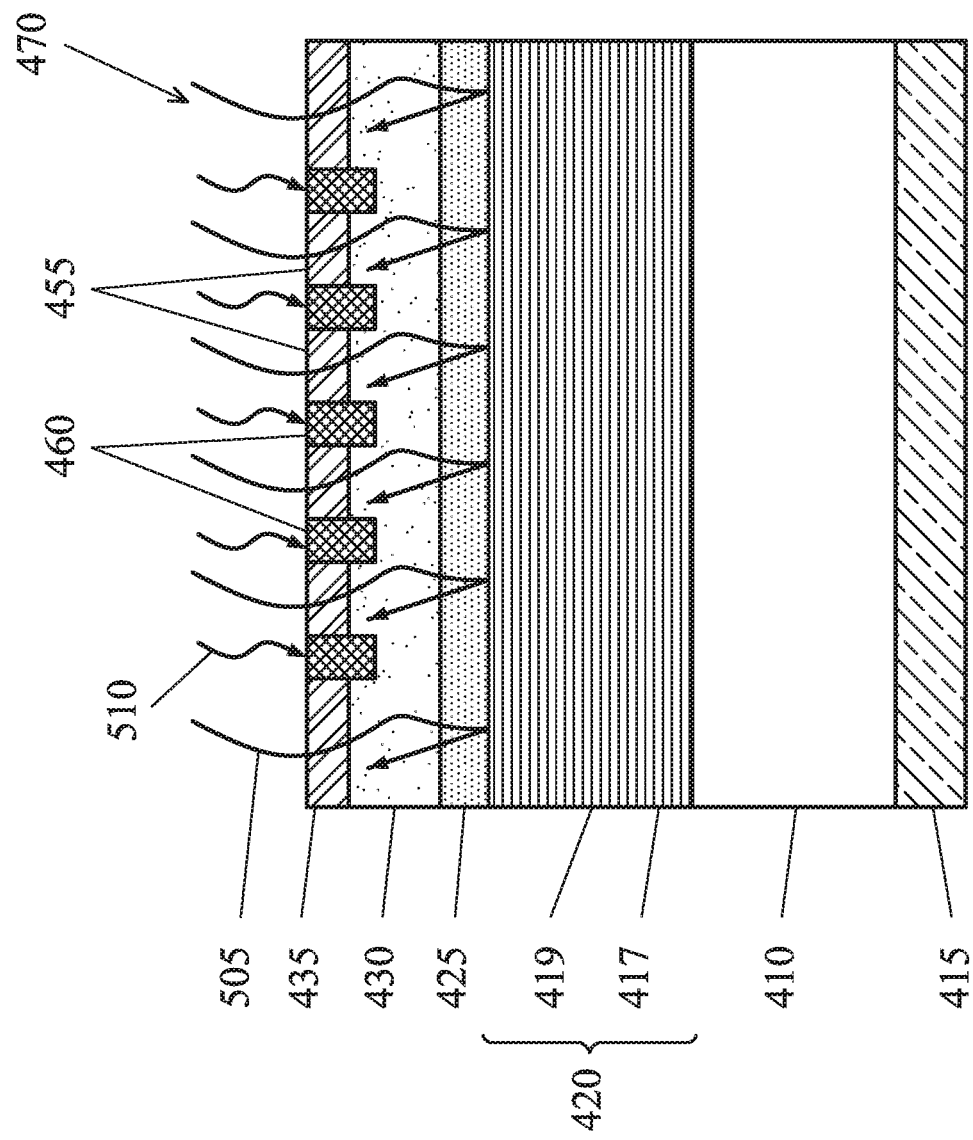
FIG. 12 is a cross sectional view of a photomask according to an embodiment of the disclosure.

Prior to using the photomask in semiconductor fabrication operations, the hard mask layer 440 is removed from the photomask 470 of FIG. 8 in some embodiments. As shown in FIG. 12, in operation, in an extreme ultraviolet photomask 470 according to some embodiments, the Mo/Si multilayer 420 reflects incident EUV radiation 505, while the optically modified portions 460 absorb incident EUV radiation 510. In some embodiments, the EUV photomask 470 is a 4× reduction mask. The EUV photomask 470 reflects incident EUV radiation in a pattern towards a semiconductor substrate coated with a photoresist (not shown) to replicate the pattern in the EUV photomask 470 on the semiconductor substrate. The EUV radiation has a wavelength of about 13.5 nm in some embodiments, and is generated by a high power $CO_2$ laser exciting Sn droplets to form a plasma. After the plasma is formed, the 13.5 nm wavelength EUV light is focused and directed towards the EUV photomask 470 using one or more mirrors so that the EUV light is incident upon the reflective multilayer 420 surface at an angle of about 6° to the normal direction in some embodiments.

Figure 13:
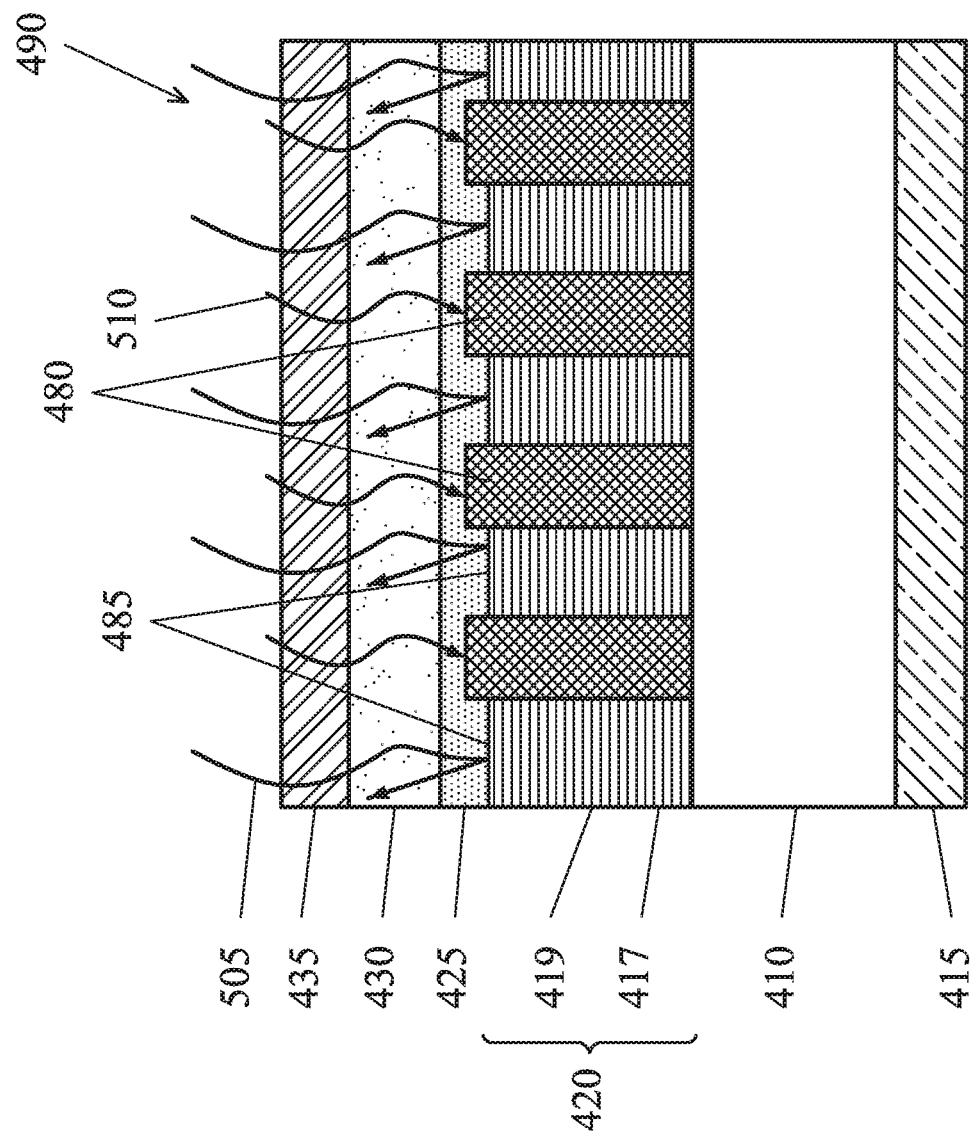
FIG. 13 is a cross sectional view of a photomask according to an embodiment of the disclosure.

In another embodiment, prior to using the photomask in semiconductor fabrication operations, the hard mask layer 440 is removed from the photomask 490 in FIG. 11. As shown in FIG. 13, in operation, in an extreme ultraviolet photomask 470 according to some embodiments, the Mo/Si multilayer 420 reflects incident EUV radiation 505, while the optically modified portions 480 absorb incident EUV radiation 510. In some embodiments, the EUV photomask 490 is a 4× reduction mask. The EUV photomask 490 reflects incident EUV radiation in a pattern towards a semiconductor substrate coated with a photoresist (not shown) to replicate the pattern on the EUV photomask 490 on the semiconductor substrate. The EUV radiation has a wavelength of about 13.5 nm in some embodiments, and is generated by a high power $CO_2$ laser exciting Sn droplets to form a plasma. After the plasma is formed, the 13.5 nm wavelength EUV light is focused and directed towards the EUV photomask 490 using one or more mirrors so that the EUV light is incident upon the reflective multilayer 420 surface at an angle of about 6° to the normal direction in some embodiments.

Figure 14:
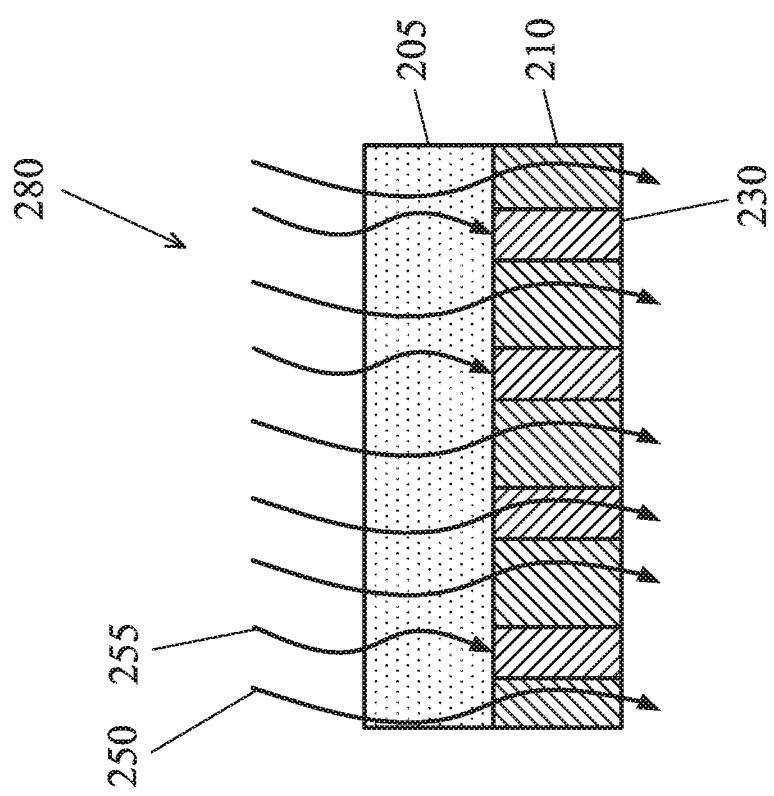
FIG. 14 is a cross sectional view of a photomask according to an embodiment of the disclosure.

Another embodiment of the disclosure is a light transmission photomask 280, as shown in FIG. 14. The light transmission photomask 280 is fabricated in a similar manner as the photomask 240 explained with reference to FIGS. 2-4 in some embodiments. The light transmission photomask 280 is used in ultraviolet photolithography operations in some embodiments. The optically modifiable layer 210 is disposed over a low thermal expansion material substrate 205 that transmits ultraviolet radiation, such as fused quartz.

As shown in FIG. 14, in operation, in an ultraviolet photomask 280 according to some embodiments, the optically modifiable material layer 210 transmits incident ultraviolet radiation 250, while the optically modified portions 230 absorb incident ultraviolet radiation 255. After passing through the photomask 280 the incident ultraviolet radiation is directed in a pattern towards a semiconductor substrate coated with a photoresist (not shown) to replicate the pattern in the photomask 280 on the semiconductor substrate. The ultraviolet radiation has a wavelength of less than about 400 nm in some embodiments. In other embodiments, the ultraviolet radiation has a wavelength of less than about 300 nm. The ultraviolet radiation is generated by an Hg lamp in some embodiments, and by an excimer laser in other embodiments.

In other embodiments, the optically modifiable material layer 210 absorbs incident ultraviolet radiation 255, while the optically modified portions 230 transmit incident ultraviolet radiation 250. Whether the optically modified portions 230 will absorb, transmit, or reflect radiation depends on the optically modifiable material, and the wavelength and power of the exposure radiation. For example, if a crystalline change is desired in the optically modifiable material, a lower power is used than if a photolysis or ionization of the optically modifiable material is desired in some embodiments. In some embodiments, a crystalline change is used to change the light transmission of an optically modifiable material. For example, if the optically modifiable material is a crystalline polymer changing the exposed portion to an amorphous state increases the light transmission of the polymer in some embodiments. Likewise, if the optically modifiable material is an amorphous polymer changing the exposed portion to a crystalline state increases the light absorption or reflectivity of the exposed portion in other embodiments.

Figure 15:
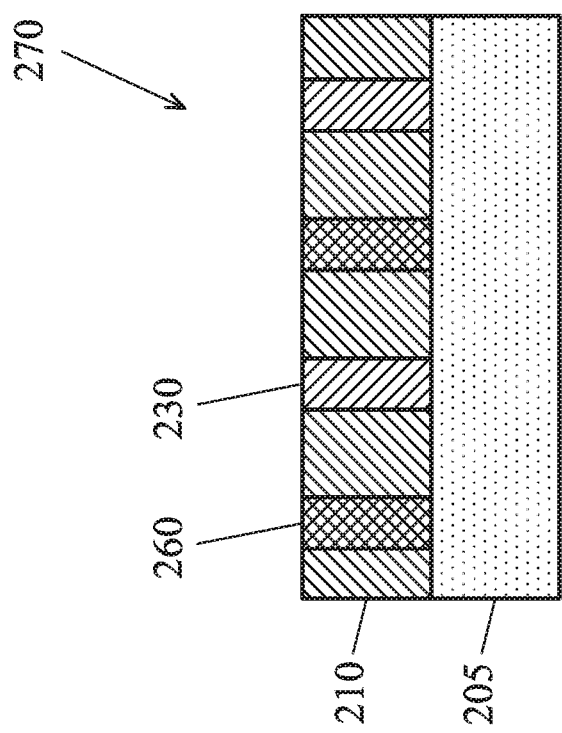
FIG. 15 is a cross sectional view of a sequential stage of a method for fabricating a photomask according to an embodiment of the disclosure.

In another embodiment of the disclosure, photomask blank 200 having a substrate 205 with an optically modifiable layer 210, as shown in FIG. 2, is subjected to two different exposures of radiation to form two different areas 230 and 260 each having a different optical property, as shown in FIG. 15. In some embodiments, a first portion of the optically modifiable layer 210 is exposed to radiation having a first wavelength and/or power to form a first optically modified portion 230 and then a second portion of the optically modifiable layer 210 is exposed to radiation having a second wavelength and/or power to form a second optically modified portion 260. In some embodiments, the extent of the optically modification is different in the first optically modified portion 230 than the second optically modified portion 260. For example, the power and/or wavelength of the exposure radiation is selected so that the change in the optical property, such as ultraviolet absorption, is less in the second optically modified portion 260 than in the first optically modified portion 230. In some embodiments, the first optically modified portion 230 absorbs or reflects substantially all the incident ultraviolet radiation when the photomask is used in operation, while the second optically modified portion 260 absorbs most of the incident ultraviolet radiation and permits some of the incident ultraviolet radiation to pass through, and the unmodified optically modifiable layer 210 allows substantially all the incident ultraviolet radiation to pass through.

In other embodiments, the first optically modified portion 230 permits substantially all the incident ultraviolet radiation to pass through when the photomask is used in operation, while the second optically modified portion 260 absorbs most of the incident ultraviolet radiation and permits some of the incident ultraviolet radiation to pass through, and the unmodified optically modifiable layer 210 absorbs substantially all the incident ultraviolet radiation.

In some embodiments, the type of the optical modification is different in the first optically modified portion 230 than the second optically modified portion 260. In some embodiments, the power and/or wavelength of the exposure radiation is selected so that in the first portion 230 the radiation-matter interaction causes a change in optical property due to one of ionization, absorption, photolysis, or crystallization, while the power and/or wavelength of the exposure radiation is selected so that the in second portion 260 the radiation-matter interaction causes a change in the optical property due to a different one of ionization, absorption, photolysis, or crystallization. For example, the change in optical property in the first portion 230 is due to ionization of the first portion and the change in optical property in the second portion 260 is due to crystallization in one embodiment.

Figure 16:
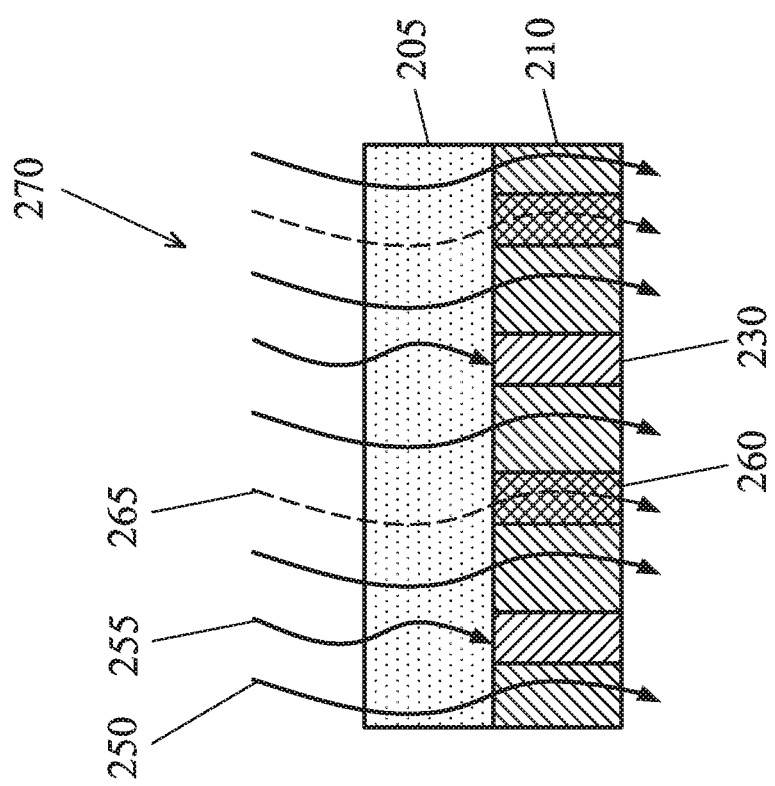
FIG. 16 is a cross sectional view of a photomask according to an embodiment of the disclosure.

The above-described technique of forming multiple portions each having different optical properties is used to form phase-shift photomasks in some embodiments, as shown in FIG. 16. Phase shift photomasks are photomasks that use light interference generated by phase differences to improve image resolution in photolithography. A phase shift photomask is shown in FIG. 16. The phase shift photomask 270 is fabricated in the manner as explained with reference to FIG. 14 in some embodiments. The optically modifiable layer 210 is disposed over a low thermal expansion material substrate 205 that transmits ultraviolet radiation, such as fused quartz.

As shown in FIG. 16, in operation, in phase shift photomask 270 according to some embodiments, the optically modifiable material layer 210 transmits incident ultraviolet radiation 250, while the first optically modified portions 230 absorb incident ultraviolet radiation 255, and the second optically modified portions 260 absorb most of the incident ultraviolet radiation 265 and transmit some of the incident ultraviolet radiation 265. In some embodiments, only a few percent of the incident ultraviolet radiation 265 is transmitted through the second optically modified portions. The light passing through the second optically modified portion 260 is not strong enough to create a pattern on a photoresist coated substrate (not shown), but it can interfere with the light passing through the transparent unexposed portions 210 of the photomask to improve pattern contrast on the photoresist coated substrate. After passing through the photomask 270 the incident ultraviolet radiation is directed in a pattern towards the photoresist coated semiconductor substrate to replicate the pattern in the photomask 270 on the semiconductor substrate. The ultraviolet radiation has a wavelength of less than about 400 nm in some embodiments. In other embodiments, the ultraviolet radiation has a wavelength of less than about 300 nm. The ultraviolet radiation is generated by an Hg lamp in some embodiments, and by an excimer laser in other embodiments.

Photomasks formed according to embodiments of the present disclosure are fabricated without lithography and etching operations in some embodiments. Thus, no particles or etching residues are generated that can subsequently become resolvable defects. In addition, because the photomask fabrication methods according to embodiments of the disclosure eliminates one or more photolithography and etching operations the photomask fabrication process is simplified.

An embodiment of the disclosure includes a method of fabricating a photomask. The method includes selectively exposing portions of a photomask blank to radiation to change an optical property of the portions of the photomask blank exposed to the radiation, thereby forming a pattern of exposed portions of the photomask blank and unexposed portions of the photomask blank. The pattern corresponds to a pattern of semiconductor device features. In an embodiment, the portions of the photomask blank exposed to the radiation is in an upper surface of the photomask blank. In an embodiment, the portions of the photomask blank exposed to the radiation is in a middle or lower portion of the photomask blank. In an embodiment, the radiation is light selected from the group consisting of infrared, visible light, ultraviolet, deep ultraviolet, and extreme ultraviolet. In an embodiment, the optical property changed is selected from the group consisting of extreme ultraviolet reflectivity, deep ultraviolet reflectivity, infrared absorption, visible light absorption, and Raman spectra. In an embodiment, the optical property change is a result of a radiation-matter interaction selected from the group consisting of ionization, absorption, photolysis, and crystallization. In an embodiment, the photomask is a light reflective photomask. In an embodiment, the photomask is a light transmission photomask.

Another embodiment of the disclosure includes a method of fabricating a photomask. The method includes forming a layer of optically modifiable material on a substrate. The layer of optically modifiable material is exposed to radiation in a patternwise manner so that portions of the layer of optically modifiable material are exposed to the radiation and portions of the layer of optically modifiable material are not exposed to the radiation. Portions of the layer of optically modifiable material exposed to radiation correspond to a pattern of semiconductor device features. Portions of the layer of optically modifiable material that are exposed to the radiation undergo a radiation-matter interaction, thereby changing an optical property of the portions that are exposed to the radiation. In an embodiment, the method includes forming a plurality of optically modifiable layers on the substrate. In an embodiment, the substrate is a low thermal expansion material. In an embodiment, the optically modifiable layer comprises multiple alternating layers of silicon and molybdenum. In an embodiment, the optically modifiable layer includes from about 30 alternating layers each of silicon and molybdenum to about 60 alternating layers each of silicon and molybdenum. In an embodiment, a hard mask layer is formed over the optically modifiable layer. In an embodiment, the optically modifiable layer further includes a capping layer. In an embodiment, the radiation-matter interaction is selected from the group consisting of ionization, absorption, photolysis, and crystallization.

Another embodiment of the disclosure is a photomask including an optically modifiable layer formed on a substrate. The optically modifiable layer includes a pattern of a first portion having a first optical property and a second portion having a modified first optical property. The pattern corresponds to a pattern of semiconductor device features. In an embodiment, the first optical property is selected from the group consisting of extreme ultraviolet reflectivity, deep ultraviolet reflectivity, ultraviolet absorption, infrared absorption, visible light absorption, and Raman spectra. In an embodiment, the photomask includes multiple alternating layers of silicon and molybdenum disposed over a first main surface of the substrate, a capping layer disposed over the multiple alternating layers of silicon and molybdenum, an absorber layer disposed over the capping layer, and a hard mask layer disposed over the absorber layer; and the optically modifiable layer is selected from the group consisting of one or more of the multiple alternating layers, capping layer, and absorber layer. In an embodiment, the photomask includes a conductive layer disposed on a second main surface of the substrate opposing the first main surface.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a photomask, comprising:
selectively exposing portions of a photomask blank, on which no circuit pattern has been formed, to an incident radiation to change an optical property of the portions of the photomask blank exposed to the incident radiation thereby forming a pattern of exposed portions of the photomask blank and unexposed portions of the photomask blank,
wherein the pattern corresponds to a circuit pattern of semiconductor device features,
wherein the incident radiation is light selected from the group consisting of infrared, visible light, ultraviolet, deep ultraviolet, and extreme ultraviolet,
wherein the optical property change includes at least one selected from the group consisting of ionization, absorption, photolysis, and crystallization, and
the photomask blank includes a hard mask layer, and the incident radiation is applied through the hard mask layer to change the optical property of one or more layers under the hard mask layer.

2. The method according to claim 1, wherein the portions of the photomask exposed to the incident radiation includes two layers of the photomask blank.

3. The method according to claim 1, wherein the portions of the photomask exposed to the incident radiation is in a middle or lower portion of the photomask blank.

4. The method according to claim 1, wherein the optical property changed is selected from the group consisting of extreme ultraviolet reflectivity, deep ultraviolet reflectivity, ultraviolet absorption, infrared absorption, visible light absorption, and Raman spectra.

5. The method according to claim 1, wherein the photomask is a light reflective photomask.

6. The method according to claim 1, wherein after the incident radiation is applied through the hard mask layer, the hard mask layer is removed.

7. The method according to claim 1, wherein the incident radiation is provided by a $CO_2$ laser-excited Sn plasma, a HeNe laser, or an ultraviolet excimer laser.

8. A method of fabricating a photomask, comprising:
selectively exposing portions of a photomask blank, which includes a layer of optically modifiable material and a hard mask layer on the layer of optically modifiable material, to an incident radiation in a patternwise manner so that first portions of the layer of optically modifiable material are exposed to the incident radiation and second portions of the layer of optically modifiable material are not exposed to the incident radiation; and
removing the hard mask layer,
wherein the incident radiation is applied to the layer of optically modifiable material through the hard mask layer,
wherein the first portions of the layer of optically modifiable material exposed to the incident radiation correspond to a circuit pattern of semiconductor device features;
wherein the first portions of the layer of optically modifiable material that are exposed to the incident radiation undergo a radiation-matter interaction, thereby changing an optical property of the first portions that are exposed to the incident radiation,
wherein the incident radiation is light selected from the group consisting of infrared, visible light, ultraviolet, deep ultraviolet, and extreme ultraviolet, and
wherein an optical property change caused by the incident radiation includes at least one selected from the group consisting of ionization, absorption, photolysis, and crystallization.

9. The method according to claim 8, further comprising forming a plurality of layers of optically modifiable material, each of which corresponds to the layer of optically modifiable material, on the substrate.

10. The method according to claim 9, wherein an entire layer of one of the plurality of layers of optically modifiable material is optically modified and only a part of another of the plurality of layers of optically modifiable material is optically modified.

11. The method according to claim 8, wherein the layer of optically modifiable material comprises multiple alternating layers of silicon and molybdenum.

12. The method according to claim 11, wherein the layer of optically modifiable material comprises from about 30 alternating layers each of silicon and molybdenum to about 60 alternating layers each of silicon and molybdenum.

13. The method according to claim 8, wherein the photomask blank further includes an antireflective layer between the hard mask layer and the layer of optically modifiable material.

14. The method according to claim 8, wherein the layer of optically modifiable material comprises a capping layer.

15. The method according to claim 8,
wherein a plurality of layers of optically modifiable material, each of which corresponds to the layer of optically modifiable material, are formed on the substrate,
wherein the plurality of layers of optically modifiable material comprise from 30 multiple alternating layers of silicon and molybdenum to 60 alternating layers each of silicon and molybdenum, and a capping layer,
wherein the substrate is a low thermal expansion material,
the optical property change in the optically modifiable material is a change in the crystallization, and
the change in the crystallization increases a light transmission of the layer of optically modifiable material.

16. The method according to claim 8, wherein the optically modifiable material is an amorphous polymer.

17. A photomask, comprising:
an optically modifiable layer having a circuit pattern formed on a substrate,
wherein a part of the circuit pattern in the optically modifiable layer has a first optical property that has been changed to a modified first optical property by exposing the optically modifiable layer to an incident radiation and a part of the circuit pattern in the optically modifiable layer has a second optical property that has an original optical property different from the modified first optical property;
wherein the pattern comprises a first portion having the first optical property and a second portion having the modified first optical property,
wherein the circuit pattern corresponds to a circuit pattern of semiconductor device features,
wherein the photomask comprises:
multiple alternating layers of silicon and molybdenum disposed over the substrate;

a capping layer disposed over the multiple alternating layers of silicon and molybdenum;

an absorber layer disposed over the capping layer; and an antireflective layer disposed over the absorber layer, wherein the optically modifiable layer is the capping layer or the absorber layer, and wherein an optical property change caused by the incident radiation includes at least one selected from the group consisting of ionization, absorption, photolysis, and crystallization.

18. The photomask of claim 17, wherein the first optical property is selected from the group consisting of extreme ultraviolet reflectivity, deep ultraviolet reflectivity, infrared absorption, visible light absorption, and Raman spectra.

19. The photomask of claim 17, wherein:

multiple optically modifiable layers, one of which is the optically modifiable layer, are provided, and an entire layer of one of the optically modifiable layers is an optically modified layer and only a part of another of the optically modifiable layer is an optically modified layer.

20. The photomask of claim 17, wherein the capping layer is made of ruthenium.

* * * * *